(12) United States Patent  (10) Patent No.: US 8,247,295 B2
Shiraishi  (45) Date of Patent: Aug. 21, 2012

(54) DMOS TYPE SEMICONDUCTOR DEVICE AND METHOD FOR MANUFACTURING THE SAME

(75) Inventor: Naohiro Shiraishi, Kanagawa (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 13/039,636

(22) Filed: Mar. 3, 2011

(65) Prior Publication Data

US 2011/0159650 A1  Jun. 30, 2011

Related U.S. Application Data

(62) Division of application No. 12/177,263, filed on Jul. 22, 2008, now abandoned.

(30) Foreign Application Priority Data

Jul. 23, 2007  (JP) ............................. P2007-190388

(51) Int. Cl.
*H01L 21/336* (2006.01)
*H01L 21/8234* (2006.01)
(52) U.S. Cl. ......... 438/268; 438/273; 438/197; 438/270
(58) Field of Classification Search .................. 438/696, 438/406, 197, 335, 259, 270, 271, 589, 273, 438/297, 301, 563, 299, 305, 306, 307, 286, 438/268, 558, 200, 276, 227, 524
See application file for complete search history.

(56) References Cited

U.S. PATENT DOCUMENTS

| 5,346,835 | A | | 9/1994 | Malhi |
| 5,396,304 | A | * | 3/1995 | Salerno et al. ................ 353/122 |
| 6,107,661 | A | * | 8/2000 | Okabe et al. .................. 257/330 |
| 6,117,738 | A | | 9/2000 | Tung |
| 6,242,787 | B1 | | 6/2001 | Nakayama |
| 6,900,101 | B2 | | 5/2005 | Lin |
| 7,109,562 | B2 | | 9/2006 | Lee |
| 7,122,449 | B2 | * | 10/2006 | Langdo et al. ................ 438/481 |
| 7,414,287 | B2 | | 8/2008 | Pendharkar |
| 7,682,909 | B2 | * | 3/2010 | Mizokuchi et al. ........... 438/270 |

FOREIGN PATENT DOCUMENTS

JP  2004-39774  2/2004

* cited by examiner

*Primary Examiner* — Chuong A. Luu
(74) *Attorney, Agent, or Firm* — Whitham Curtis Christofferson & Cook, PC

(57) ABSTRACT

A DMOS type semiconductor device and a method for manufacturing the same are provided. An isolation oxide layer with an ion implantation opening is formed on a semiconductor. A gate oxide film is formed on the semiconductor within the ion implantation opening. A gate is formed on the isolation oxide layer and the gate oxide film. A body layer diffusively formed in the semiconductor by implanting ions of an impurity element having a first conduction type from the ion implantation opening. A regulation layer which is shallower than the body layer is diffusively formed in the body layer by implanting ions of an impurity element having a second conduction type opposite to the first conduction type from the ion implantation opening. A source layer is diffusively formed in the regulation layer by implanting ions of an impurity element having the second conduction type from the ion implantation opening. The regulation layer is formed so as to horizontally extend beyond a region in which a gate bird's beak occurs from an end of the gate toward underlying layers of the gate.

4 Claims, 6 Drawing Sheets

DMOS TYPE SEMICONDUCTOR DEVICE AND METHOD FOR MANUFACTURING THE SAME

This application claims priority from Japanese Patent Application No. 2007-190388 filed Jul. 23, 2007, and this application is a divisional patent application of U.S. patent application Ser. No. 12/177,263 filed Jul. 22, 2008 now abandoned, the entire contents of which are herein incorporated by reference.

BACKGROUND

Devices and methods consistent with the present invention relate to a DMOS (Double Diffused Metal Oxide Semiconductor) type semiconductor device and a method for manufacturing the same.

As shown in FIG. 9, In a DMOS type semiconductor device (hereinafter abbreviated as "DMOS") 100, an ion implantation opening 103 is formed in an isolation oxide layer 102 formed on a surface of a semiconductor layer (epitaxial growth layer) 101. In addition, in the DMOS 100, a body layer 104 is formed by implanting (doping) ions of an impurity element of a first conduction type from the ion implantation opening 103 and a source layer 105 and a back gate layer 106 are formed by implanting ions of an impurity element of a second conduction type opposite to the first conduction type using the same ion implantation opening 103. The DMOS 100 has an effect of achieving a short channel with ease and achieving high voltage resistance by a shape of the body layer 104 as a difference in a surface portion between diffusion depth of the body layer 104 and diffusion depth of the source layer 105 is configured as a channel length c, as shown in FIG. 11.

A conventional method for manufacturing the DMOS 100 is generally to form an n-type buried diffusion layer 108 by diffusing impurity ions into a p-type silicon substrate 107 through implantation of ions from a main surface of the silicon substrate 107 and form an n-type epitaxial growth layer 101 on the buried diffusion layer 108 and the main surface of the silicon substrate 107. This manufacturing method forms a relatively thick isolation oxide layer 102 on the epitaxial growth layer 101 using, for example, a LOCOS (Local Oxidation of Silicon) method. At this time, the ion implantation opening 103 is formed.

This manufacturing method forms a gate 110 on the epitaxial growth layer 101 through a gate oxide film 109 (see FIG. 10). This manufacturing method diffusively forms the body layer 104 in the epitaxial growth layer 101 by implanting ions of a p-type impurity element into the epitaxial growth layer 101 in self-alignment of some of the gate 110 in conjunction with the ion implantation opening 103. This manufacturing method diffusively forms a thin source layer 105 in the body layer 104 by implanting ions of an n-type impurity element into the body layer 104 in self-alignment of some of the gate 110 (see FIG. 11). This manufacturing method diffusively forms the back gate layer 106 in the body layer 104 by implanting ions of a p-type impurity element from the ion implantation opening 103 into the body layer 104.

This manufacturing method diffusively forms a drift layer 113 in the epitaxial growth layer 101 by implanting ions of an n-type impurity element into the epitaxial growth layer 101 at the same time of forming the above-mentioned source layer 105 or through a separate process, and additionally diffusively forms a drain layer 114 in the drift layer 113 by implanting ions of an n-type impurity element into the drift layer 113. In addition, this manufacturing method manufactures the DMOS 100 by carrying out an electrode forming process and the like, as shown in FIG. 9.

Patent Document 1 discloses an N channel type high voltage resistant transistor of a DMOS type with improved voltage resistance between a source and a drain in a state where the transistor is turned on and channel current flows through the transistor. The high voltage resistant transistor has a body layer including a first body layer formed to include a channel region between a source layer and a drain layer and a second thin body layer projecting from the first body layer toward a region under the drain layer, for the purpose of improvement of a voltage resistance characteristic by alleviating an electric field by a drain voltage in the body layer.

Patent Document 1: Japanese Patent Publication No. 2004-39774 A

In the DMOS 100, an annealing treatment (thermal oxidation treatment) is carried out while the source layer 105 and the back gate layer 106 are being formed after the body layer 104 is formed. In the DMOS 100, while the gate 110 is formed on the gate oxide film 109, the gate oxide film 109 at an end of the gate 110 is affected by the thermal oxidation treatment carried out in the above-mentioned post-process, thereby producing a gate bird's beak 115 unstable in its thickness or shape as shown in FIG. 11.

In the DMOS 100, as described above, the source layer 105 is diffusively formed in the body layer 104 by implanting ions of an impurity element from the ion implantation opening 103 into the body layer 104. In the DMOS 100, although the ions of the impurity element is implanted in self-alignment of an end of the gate 110 at that time, diffusion of the ions from the end of the gate 110 into a region under the end of the gate 110 is small. On this account, in the DMOS 100, the source layer 105 is formed in the body layer 104 over a region in which the above-mentioned gate bird's beak 115 is produced.

In the DMOS 100, as described above, the difference in the surface portion between the diffusion depth of the body layer 104 and the diffusion depth of the source layer 105 is configured as the channel length C. In the DMOS 100, since the source layer 105 is formed over the region in which the gate bird's beak 115 is formed, the source layer 105 is affected by irregularity of the thickness and shape of the gate bird's beak 115, which results in an irregular characteristic of the semiconductor 100 and a low yield thereof.

SUMMARY

It is therefore an object of the present invention to provide a DMOS type semiconductor device (DMOS) which is capable of achieving its improved characteristic by forming a stable source layer without being affected by a gate bird's beak, and a method for manufacturing the same.

In order to achieve the above-mentioned object, according to an aspect of an embodiment of the present invention, there is provided a DMOS type semiconductor device, comprising: a semiconductor; an isolation oxide layer, formed on the semiconductor and formed with an ion implantation opening; a gate oxide film, formed on the semiconductor within the ion implantation opening; a gate, formed on the isolation oxide layer and the gate oxide film; a body layer, diffusively formed in the semiconductor by implanting ions of an impurity element having a first conduction type from the ion implantation opening; a regulation layer, shallower than the body layer and diffusively formed in the body layer by implanting ions of an impurity element having a second conduction type opposite to the first conduction type from the ion implantation opening; and a source layer, diffusively formed in the regulation layer by implanting ions of an impurity element having the second conduction type from the ion implantation opening, wherein the regulation layer is formed so as to horizontally extend beyond a region in which a gate bird's beak occurs from an end of the gate toward underlying layers of the gate.

According to another aspect of an embodiment of the present invention, there is provided a method for manufacturing a DMOS type semiconductor device, comprising: providing a silicon substrate; diffusively forming a buried diffusion layer on a main surface of the silicon substrate; forming an epitaxial growth layer on the silicon substrate and the buried diffusion layer; forming an isolation oxide layer on the epitaxial growth layer with an ion implantation opening; forming a gate oxide film on the epitaxial growth layer within the ion implantation opening; forming a gate on the gate oxide film; diffusively forming a body layer in the epitaxial growth layer by implanting ions of an impurity element having a first conduction type from the ion implantation opening; diffusively forming a regulation layer in the body layer by implanting ions of an impurity element having a second conduction type opposite to the first conduction type from the ion implantation opening, the regulation layer being shallower than the body layer; and diffusively forming a source layer in the regulation layer by implanting ions of an impurity element having the second conduction type from the ion implantation opening, wherein the regulation layer is formed so as to horizontally extend beyond a region in which a gate bird's beak occurs from an end of the gate toward underlying layers of the gate.

The regulation layer may be formed by implanting the ions of the impurity element into the body layer using the end of the gate as a self-alignment. The regulation layer may be formed by obliquely implanting the ions of the impurity element from the ion implantation opening. A part of the regulation layer may be formed beneath a part of the gate through the gate oxide film.

BRIEF DESCRIPTION OF THE DRAWINGS

The above and other aspects of the present invention will become more apparent by describing in detail exemplary embodiments thereof with reference to the accompanying drawings, wherein.

DETAILED DESCRIPTION OF EXEMPLARY EMBODIMENTS

Figure 1:
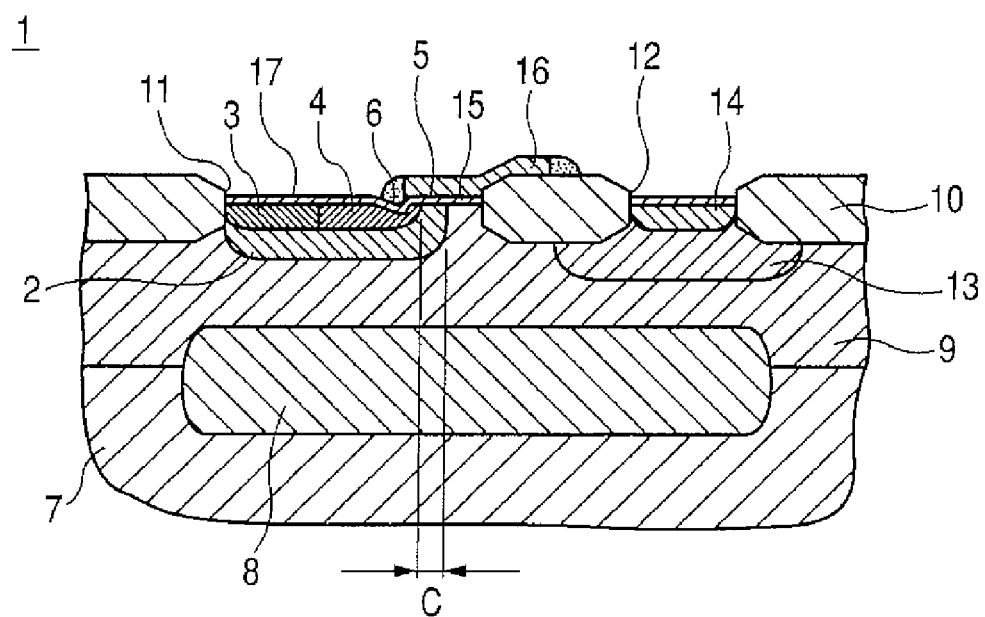
FIG. 1 is a sectional view of a main part of a DMOS according to an embodiment of the present invention.

Hereinafter, a DMOS 1 and a method for manufacturing the same according to an embodiment of the present invention will be described in detail with reference to the drawings. A DMOS 1 shown in FIGS. 1 and 2 according to an embodiment has the same essential configuration as the above-described conventional DMOS 100 except that a difference in a surface portion between diffusion depth of a body layer 2 and diffusion depth of a source layer 4 formed, together a back gate layer 3, in the body layer 2 becomes channel length C, as will be described later. The DMOS 1 has an effect of achieving a short channel with ease and achieving high voltage resistance by forming the body layer 2 into a proper shape.

The DMOS 1 forms a source forming regulation layer 5 in the body layer 2 in advance and forms the source layer 4 in the source forming regulation layer 5, as will be described in detail later. In the DMOS 1, the source forming regulation layer 5 is formed of a diffusion layer horizontally extending beyond a region in which a gate bird's beak 6 is produced due to thermal oxidation treatment or the like performed after the body layer 2 is formed. In the DMOS 1, the source layer 4 is formed to have its stable thickness and shape in the source forming regulation layer 5 without being little affected by the gate bird's beak 6 having high irregularity of its thickness and shape. In the DMOS 1, this configuration allows stable channel length C to be formed between the body layer 2 and the source forming regulation layer 5, which may result in reduction of irregularity of a characteristic and increase of a yield of the DMOS 1.

In the DMOS 1, a buried diffusion layer 8 is formed in a p-type silicon substrate 7 by implanting ions of an n+ type impurity element into a predetermined region of a main surface of the silicon substrate 7 using an ion implanter so as to diffuse the ions of the impurity element into the silicon substrate 7. In the DMOS 1, an n− type epitaxial growth layer 9 is formed over the silicon substrate 7 and the buried diffusion layer 8 using, for example, an epitaxial growth apparatus. In the DMOS 1, a thick isolation oxide layer (LOCOS oxide layer) 10 is formed on the epitaxial growth layer 9 using a LOCOS method.

In the DMOS 1, the isolation oxide layer 10 forms a first ion implantation opening 11 and a second ion implantation opening 12 to be formed therein with a drain layer 14. In the DMOS 1, the first ion implantation opening 11 is also used as an ion implantation opening for forming a back gate layer to be formed in the body layer 2.

By subjecting the DMOS 1 to thermal oxidation treatment, a gate oxide film 15 serving as an insulating film is formed in a gate region. In the DMOS 1, a gate 16 extending over a portion of the isolation oxide layer 10 to divide the first ion implantation opening 11 and the second ion implantation opening 12 is formed on the gate oxide film 15.

In the DMOS 1, the body layer 2 is formed by implanting ions of a p type impurity element from the first ion implantation opening 11 into the epitaxial growth layer 9 using an ion implanter so as to diffuse the implanted ions of the p type impurity element into the epitaxial growth layer 9 to predetermined width and depth. In the DMOS 1, with the first ion implantation opening 11 being masked to be opened on a surface of the formed body layer 2 in a predetermined range, the source forming regulation layer 5 is diffusively formed in the body layer 2 by implanting ions of an n type impurity element into the body layer 2 using an ion implanter.

In the DMOS 1, the back gate layer 3 adjacent to the source forming regulation layer 5 is diffusively formed in the body layer 2 by implanting ions of a p type impurity element using an ion implanter with the first ion implantation opening 11 being masked. Likewise, in the DMOS 1, the source layer 4 is diffusively formed in the source forming regulation layer 5 by implanting ions of an n type impurity element using the ion implanter with the first ion implantation opening 11 being masked.

In the DMOS 1, a drift layer 13 is formed by implanting ions of an n type impurity element into a specified region using an ion implanter so as to diffuse the implanted ions of the n type impurity element into the epitaxial growth layer 9 to predetermined width and depth. In the DMOS 1, a thin drain layer 14 is diffusively formed in a region defined by the isolation oxide film 10 of the drift layer 13, as shown in FIG. 1, by implanting ions of an n type impurity element from the second ion implantation opening 12 into the drift layer 13.

The DMOS 1 is subjected to thermal oxidation treatment for crystal stabilization and insulation maintenance while forming the source layer 4, the back gate layer 3 and so on after forming the body layer 2. In the DMOS 1, as the gate oxide film 15 is affected by the thermal oxidation treatment carried out in the post-process, the gate bird's beak 6 unstable in its thickness and shape is produced at an end of the gate 16. In the DMOS 1, since the source layer 4 formed in self-alignment with the gate 16 is formed in the source forming regulation layer 5 formed in the body layer 2 in advance, as described above, the source layer 4 is formed to have stable thickness and shape without being affected by the gate bird's beak 6.

Figure 2:
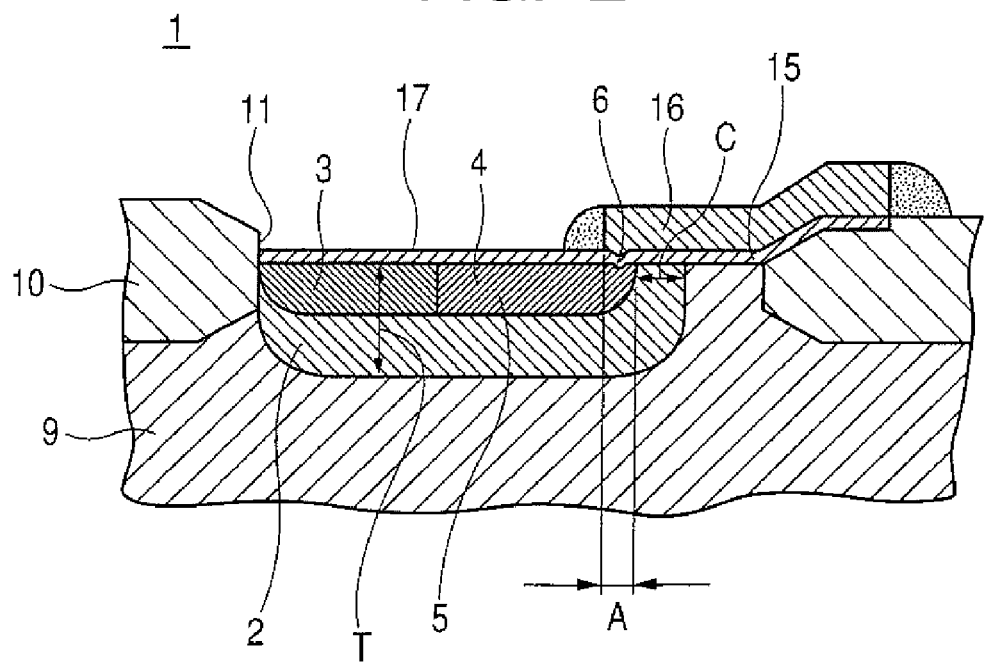
FIG. 2 is an explanatory view of a configuration of a gate bird's beak produced in a source forming regulation layer formed in a body layer and a gate oxide film.
Figure 3:
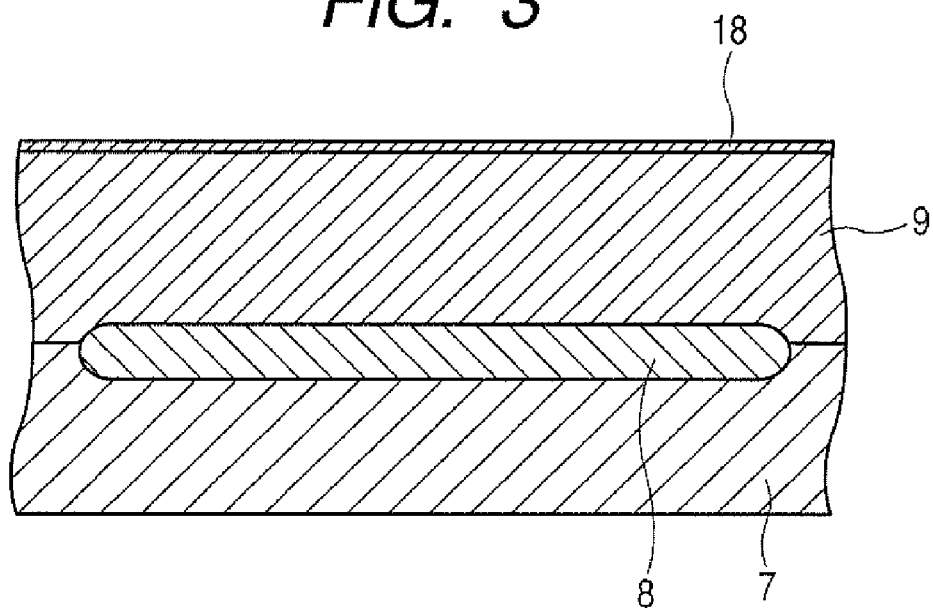
FIG. 3 is an explanation view of a process of manufacturing a DMOS, showing a process of forming a buried diffusion layer and an epitaxial growth layer on a silicon substrate.

The source forming regulation layer 5 is shallower than the body layer 2, as shown in FIGS. 1 and 2, and is formed as a diffusion layer horizontally extending beyond a producing region of the gate bird's beak 6 with respect to an end of the gate 16 by a process of implanting ions of an impurity element, which will be described later. Although the source forming regulation layer 5 is formed by diffusing the ions of the impurity element implanted from the first ion implantation opening 11 from the end of the gate 16 into a region under the end of the gate 16, the source forming regulation layer 5 is diffusively formed to meet a condition of $1.25A \approx Xj < T$, where A is the amount of spreading of the source forming regulation layer 5, Xj is the amount of depth of diffusion of the source forming regulation layer 5 into the body layer 2, and T is thickness of the body layer 2.

In the DMOS 1, after the source forming regulation layer 5 is formed in the body layer 2 in advance and then is subjected to a predetermined process, as described above, the source layer 4 is formed in the body layer 2 with the source layer 4 regulated by the source forming regulation layer 5. Accordingly, in the DMOS 1, the source layer 4 is formed to have stable thickness and shape without being affected by the gate bird's beak 6 produced at the end of the gate 16. In the DMOS 1, since channel length based on a difference in a surface portion between the diffusion depth of the body layer 2 and the diffusion depth of the source forming regulation layer 5 is maintained with high precision, it is possible to achieve reduction of irregularity of a characteristic and increase of a yield of the DMOS 1.

A process of manufacturing the above-described DMOS 1 has substantially the same basic steps as the conventional DMOS 100, mainly including a buried diffusing layer forming step, an epitaxial growth layer and pad silicon oxide film forming step, a silicon nitride film forming step, a silicon nitride patterning step and an isolation oxide layer forming step, and forms the first ion implantation opening 11 and the second ion implantation opening 12.

The process of manufacturing the DMOS 1 further includes a gate oxide film forming step, a gate forming step, a body layer forming step, a drift layer forming step and an oxide film forming step. The process of manufacturing the DMOS 1 manufactures the DMOS 1 by performing a source layer forming step, a drain layer forming step, a gate conducting step and so on after performing a characteristic source forming regulation layer forming step as a step subsequent to the body layer forming step. In addition, in the process of manufacturing the DMOS 1, although the DMOS 1 may be manufactured through various conventional steps without being limited to the above-mentioned steps, the source forming regulation layer forming step is carried out as a step previous to the source layer forming step.

The buried diffusion layer forming step forms an opening in a silicon oxide film through a photolithographic method including a series of processes such as, for example, forming a photoresist layer, forming an opening (or removing a portion other than the opening) by sensitizing (or exposing, the same as above) a predetermined region, etching a silicon oxide film in an opening, etc. The buried diffusion layer forming step forms the buried diffusion layer 8 by implanting ions of an n type impurity element from an opening into the silicon substrate 7 using an ion implanter with the silicon oxide film as a mask film to bury and diffuse the ions into the silicon substrate 7.

In the process of manufacturing the DMOS 1, the epitaxial growth layer and pad silicon oxide film forming step includes a step of removing a silicon oxide film remaining on the silicon substrate 7, a step of forming the epitaxial growth layer 9, a step of forming a pad oxide film 18, etc. The epitaxial growth layer and pad silicon oxide film forming step forms an n type epitaxial growth layer 9 on the silicon substrate 7 and the buried diffusion layer 8 using an epitaxial grower with the silicon oxide film, which remains on a main surface of the silicon substrate 7, removed by an etching process or the like. The epitaxial growth layer and pad silicon oxide film forming step forms the n type epitaxial growth layer 9 at thickness of 10 nm to 50 nm or so.

In the process of manufacturing the DMOS 1, the silicon nitride forming step forms a silicon nitride film, which is an oxidation resistant film, on the pad oxide film 18. The silicon nitride forming step forms a silicon oxide film having predetermined thickness using, for example, an LPCVD (Low Pressure Chemical Vapor Deposition) method in which nitrogen gas is supplied on the epitaxial growth layer 9 via the pad oxide film 18 under a decompressed condition.

In the process of manufacturing the DMOS 1, the silicon nitride film patterning step including the above-mentioned photolithographic method performs a patterning to remove the silicon nitride film from the pad oxide film 18, leaving corresponding portions of the first ion implantation opening 11 and the second ion implantation opening 12, which oppose the buried diffusion layer 8.

In the process of manufacturing the DMOS 1, the isolation oxide layer forming step forms the isolation oxide layer 10 having predetermined thickness. The isolation oxide layer forming step selectively forms the isolation oxide film 10 having thickness of 500 nm to 1000 nm or so using a nitrogen combustion oxidation method under a high-temperature circumstance of 1000° C., for example, while suppressing the corresponding portions of the first ion implantation opening 11 and the second ion implantation opening 12 with the silicon nitride film, from which a photoresist layer is removed, as an oxidation resistant film. The isolation oxide layer forming step forms the thick isolation oxide layer 10 formed therein with the first ion implantation opening 11 and the second ion implantation opening 12 by removing the silicon nitride film 12 left on a main surface using, for example, a dry etching process.

In the process of manufacturing the DMOS 1, the gate oxide film forming step forms the gate oxide film 15 by coating an opening of the isolation oxide layer 10. The gate oxide film forming step removes a resist layer from the isolation oxide layer 10 and then forms the gate oxide film 15 having optimized thickness on the opening using an HCl oxidation method or the like to oxidize the isolation oxide layer 10 in dry oxygen of a hydrogen chloride (HCl)-containing atmosphere, for example.

Figure 4:
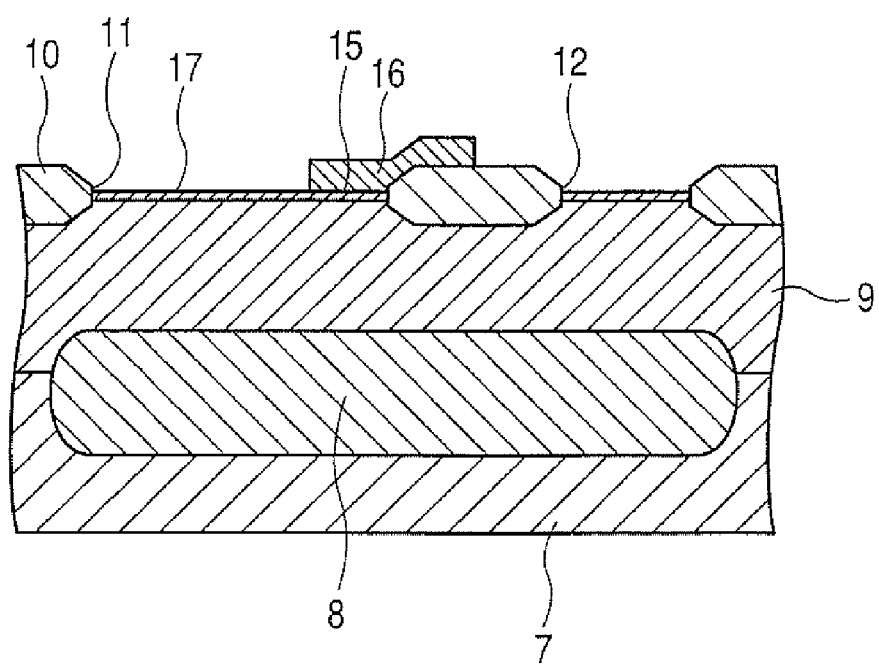
FIG. 4 is an explanation view of a process of forming an ion implantation opening and a gate on an isolation oxide layer.

In the process of manufacturing the DMOS 1, the gate forming step forms the gate 16 on the gate oxide film 15, detail of which is omitted. The gate forming step forms the gate 16 on the gate oxide film 15, extending over a portion of the first ion implantation opening 11 and a portion of the isolation oxide layer 10 to divide the first ion implantation opening 11 and the second ion implantation opening 12 through processes such as depositing polycrystalline silicon, making resistance small, photographic processing and so on, detail of which is omitted (see FIG. 4).

In the process of manufacturing the DMOS 1, the body layer forming step forms the body layer 2 by implanting ions of an impurity element from the first ion implantation opening 11. The body layer forming step implants ions of a p type impurity element from the first ion implantation opening 11 using an ion implanter in self-alignment of the gate 16 with the isolation oxide layer 10. The body layer forming step forms the body layer 2 as a diffusion layer which has predetermined diffusion depth (layer thickness T) and horizontally extends over a region under an end of the gate 16 to a region under the end of the gate 16 as implanted ions of an impurity element are diffused into the epitaxial growth layer 7 to predetermined width and depth.

Figure 5:
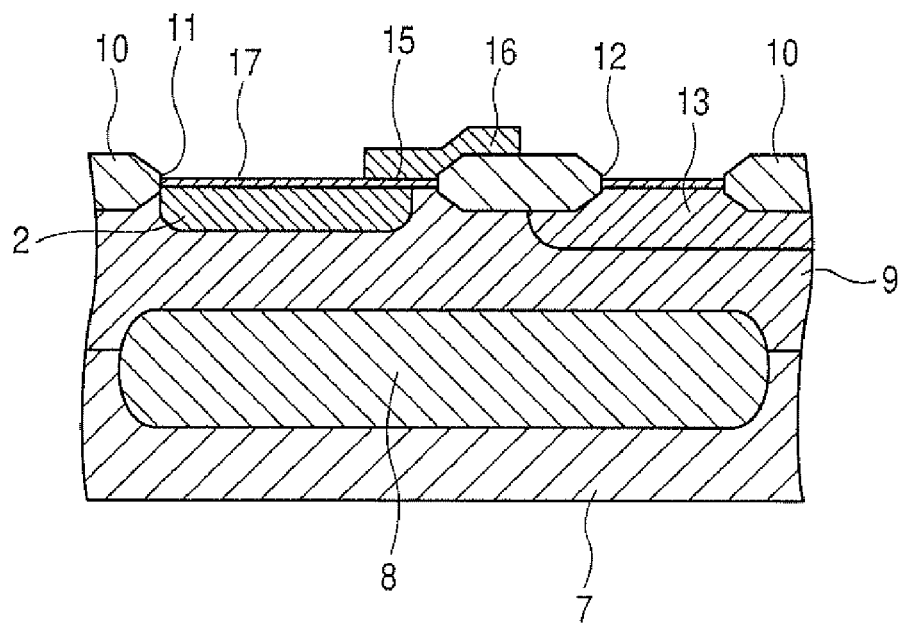
FIG. 5 is an explanation view of a process of diffusively forming a body layer and a drift layer.

In the process of manufacturing the DMOS 1, the drift layer forming step forms the drift layer 13 by implanting ions of an impurity element into a specified region. The drift layer forming step implants ions of an n type impurity element into the specified region using an ion implanter. The drift layer forming step forms the drift layer 13 by diffusing the implanted ions of the impurity element into the epitaxial growth layer 9 to predetermined and width and depth (see FIG. 5).

In the process of manufacturing the DMOS 1, subsequently to the above-described body layer forming step and the drift layer forming step, the oxide film forming step performs thermal oxidation treatment for crystallization recovery or the like. In the process of manufacturing the DMOS 1, as the gate oxide film 15 is affected by the oxide film forming step, there occurs the gate bird's beak 6 having its changed thickness and shape and large irregularity in a region extending from the end of the gate 16 to a layer under the end of the gate 16.

Figure 6:
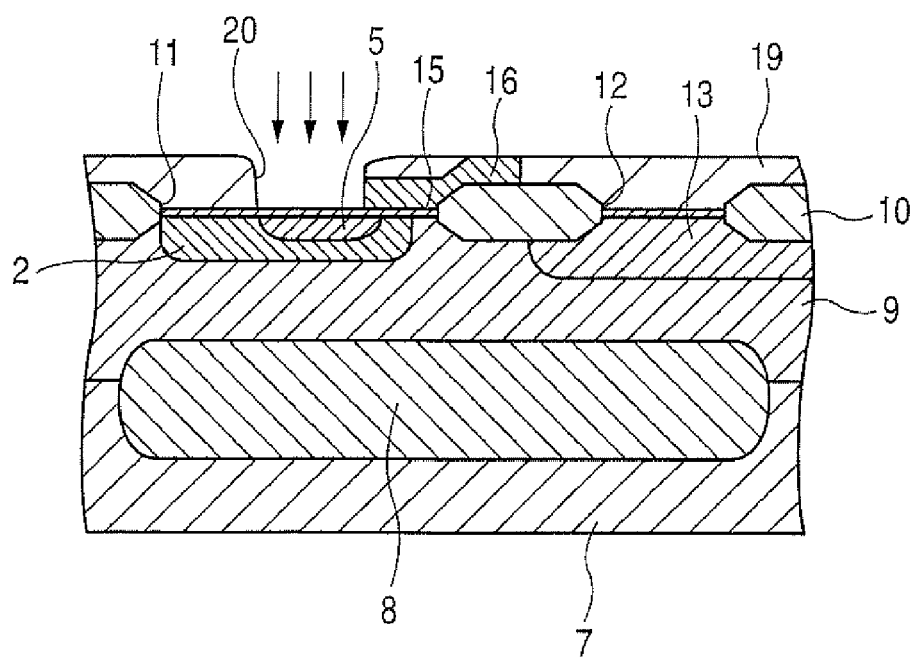
FIG. 6 is an explanation view of a process of diffusively forming a source forming regulation layer by implanting ions of an impurity element into a body layer.

In the process of manufacturing the DMOS 1, the source forming regulation layer forming step forms the source forming regulation layer 5 for forming a stable source layer 4 in the body layer 2. The source forming regulation layer forming step forms a resist layer 19, performs a photolithographic process for the resist layer 19 to form an opening 20 by exposing a corresponding portion of the body layer 2, and forms the source forming regulation layer 5 having thickness smaller than the thickness T of the body layer 2 in the body layer 2 by implanting ions of an n type impurity element from the opening 20 into the body layer 2, as indicated by an arrow (see FIG. 6).

The source forming regulation layer forming step forms the opening 20 such that an opening edge of the opening 20 has substantially the same plane as or becomes larger than the end of the gate 16, and implants ions of an impurity element in self-alignment of the gate 16. The source forming regulation layer forming step is controlled such that the implanted ions of the impurity element are diffused to horizontally spread by a spreading amount A beyond the gate bird's beak with respect to the end of the gate 16. The source forming regulation layer forming step controls horizontal spreading diffusion by, for example, adjusting diffusion concentration of the ions of the impurity element or adjusting annealing time. In addition, the source forming regulation layer forming step implants the ions of the impurity element to meet the condition of $1.25A \approx Xj < T$, where A is the horizontal spreading amount and Xj is the amount of depth of diffusion in the body layer 2, as described above.

Figure 7:
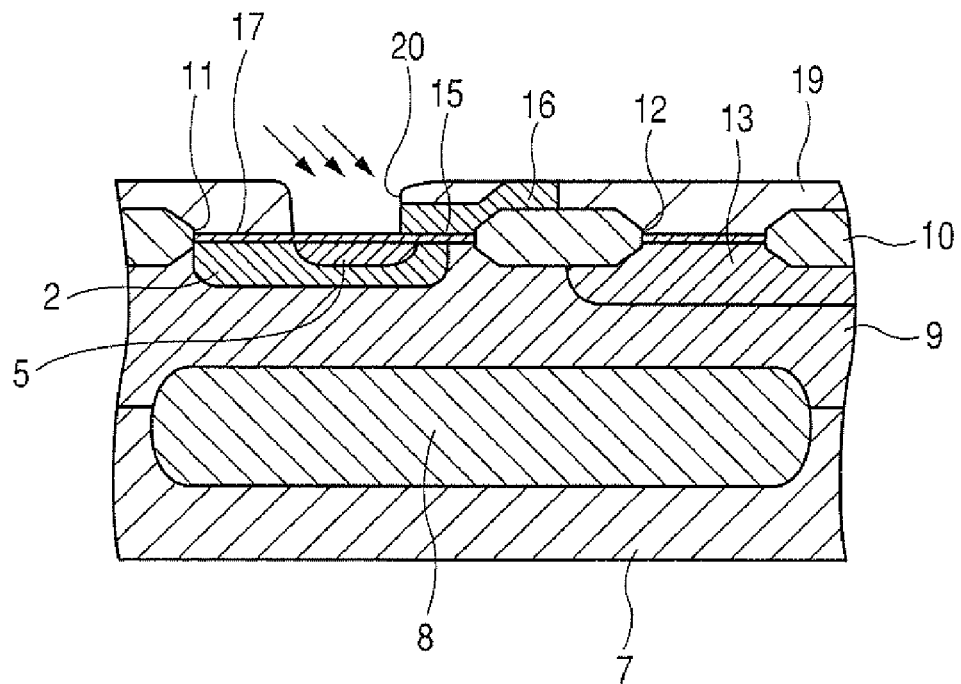
FIG. 7 is an explanation view of a process of diffusively forming a source forming regulation layer in a body layer by subjecting a body layer to oblique ion implantation.
Figure 8:
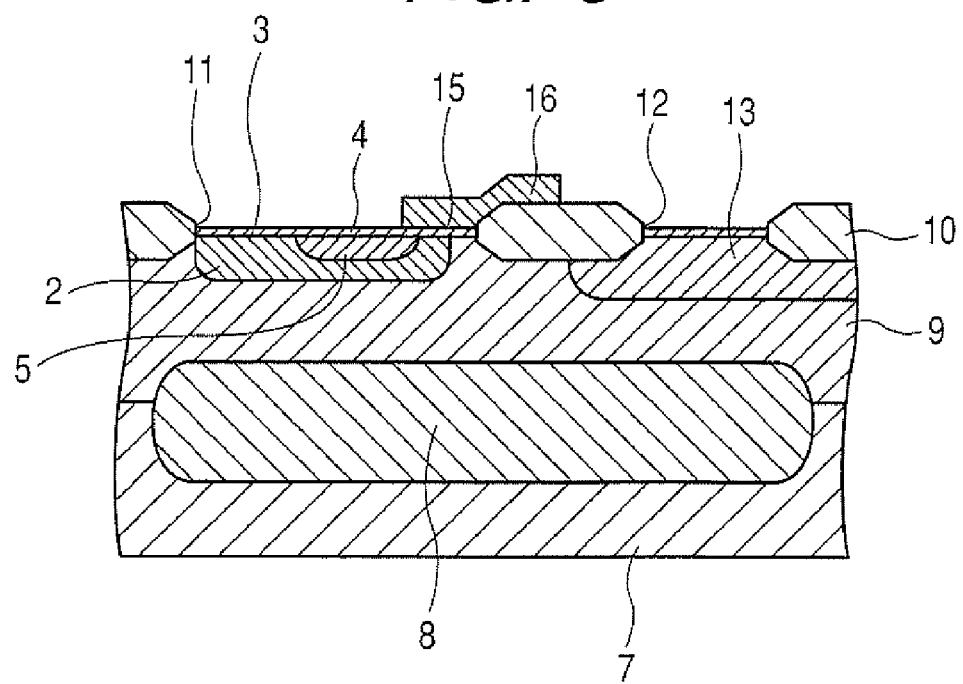
FIG. 8 is an explanation view of a process of forming a source layer in a source forming regulation layer.
Figure 9:
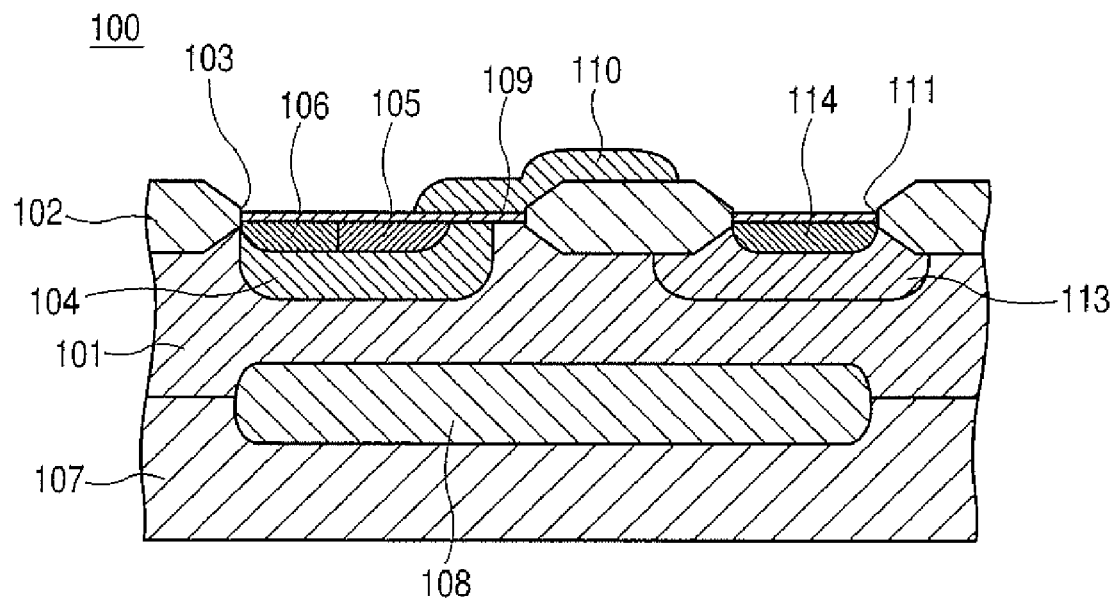
FIG. 9 is a sectional view of a main part of a conventional DMOS.
Figure 10:
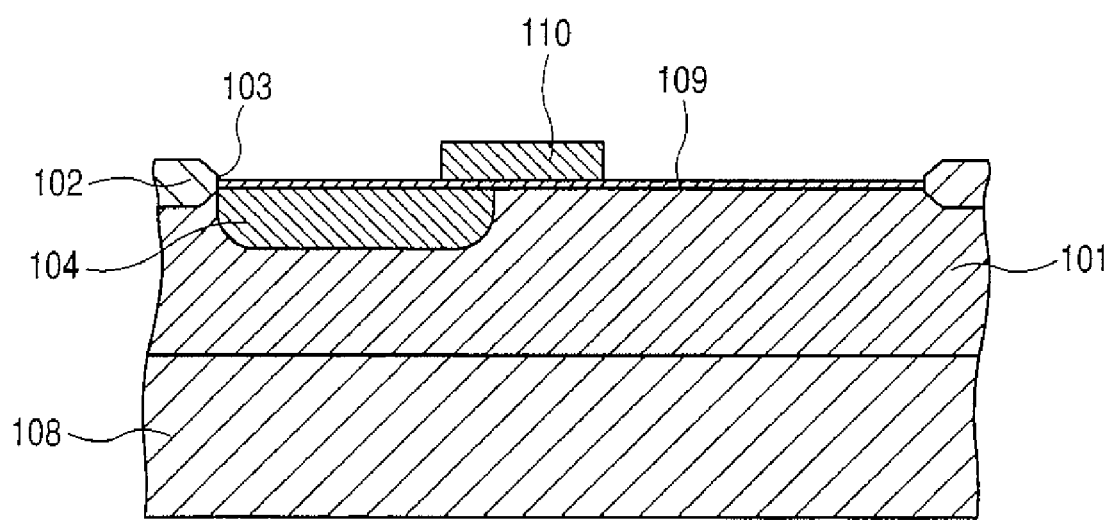
FIG. 10 is an explanatory view of a process of manufacturing a conventional DMOS, showing a process of forming a body layer.
Figure 11:
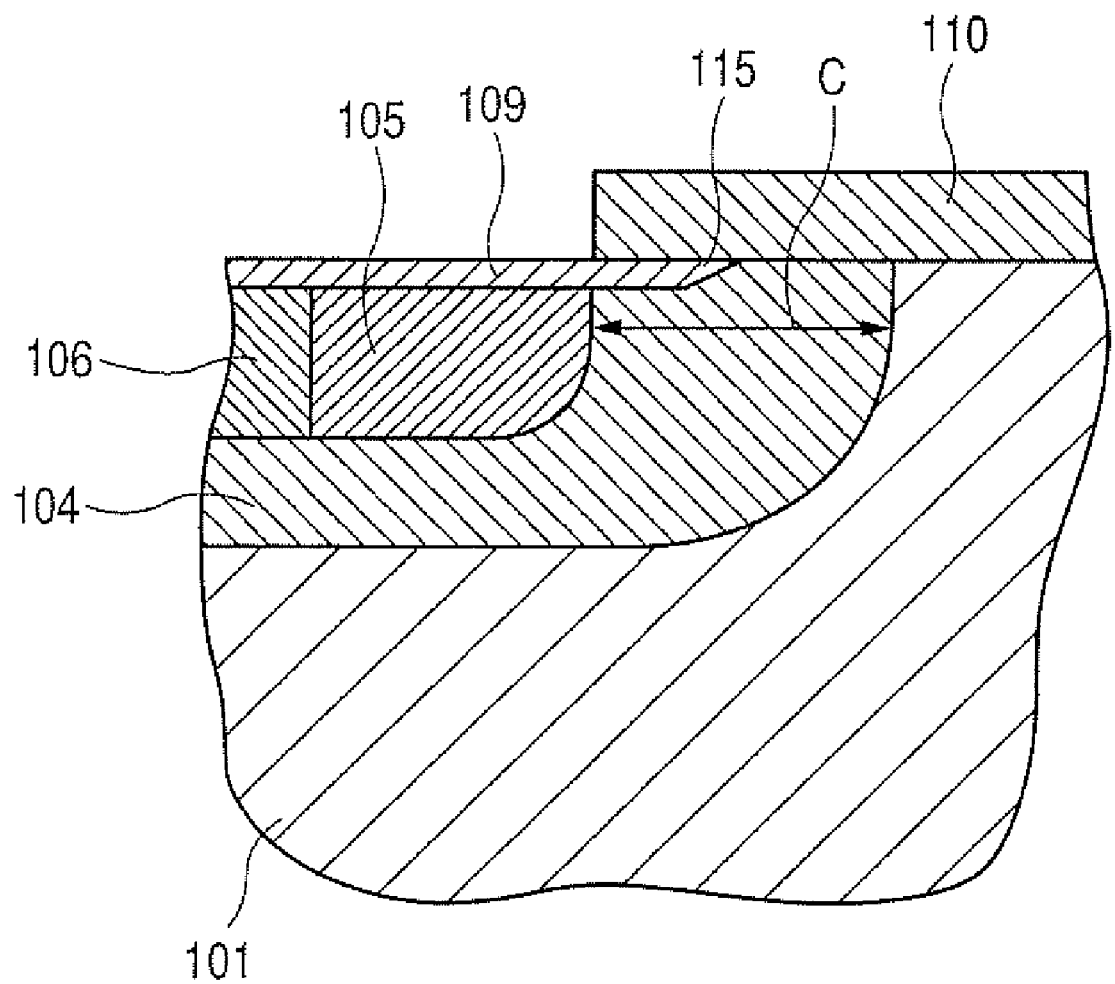
FIG. 11 is an explanatory view of a process of forming a source layer in a body layer.

In the source forming regulation layer forming step, the source forming regulation layer 5 may be formed by diffusing the ions of the impurity element such that the ions horizontally spread beyond the region in which the gate bird's beak 6 is produced with respect to the end of the gate 16, using other suitable methods without being limited to the implantation of ions of the impurity element according to the above-described control condition. The source forming regulation layer forming step may form the source forming regulation layer 5 by diffusing the ions of the impurity element such that the ions horizontally spread beyond the region in which the gate bird's beak 6, using a so-called oblique implantation method to obliquely implant the ions of the impurity element toward the end of the gate 16, for example, as indicated by an arrow in FIG. 7.

In the process of manufacturing the DMOS 1, through a step of removing the resist layer 19 to form the source forming regulation layer 5 and a step of recovery thermal oxidation treatment of the oxide film 17, the source layer forming step is performed to form the source layer 4 in the source forming regulation layer 5. The source layer forming step forms a resist layer on the source forming regulation layer 5, performs a photolithographic process for the resist layer to form an opening by exposing a corresponding portion of the source forming regulation layer 5, and forms the source layer 4 in a forming region regulated by the source forming regulation layer 5 by implanting ions of an n type impurity element from the opening into the body layer 2.

In the process of manufacturing the DMOS 1, at the same time of the above-described source layer forming step or separately, the drain layer forming step is performed to form the drain layer 14 in the drift layer 13. The drain layer forming step forms the drain layer 14 shallower than the drift layer 13 by implanting ions of an n type impurity element from the second ion implantation opening 12 into the drift layer 13 in self-alignment of the isolation oxide layer 10.

In the process of manufacturing the DMOS 1, between the above-described body layer forming step and the above-described source layer forming step, the source forming regulation layer forming step is performed to form the source forming regulation layer 5 which is a diffusion layer horizontally further extending beyond the region in which the gate bird's beak 6 having irregularity in its thickness and shape extends from the end of the gate 16 to a layer under the end of the gate 16 by thermal oxidation treatment or the like carried out after the gate oxide film 15 is formed. In the process of manufacturing the DMOS 1, as the source layer 4 is formed to have a stable shape in a range of the beforehand-formed source forming regulation layer 5 without being affected by irregularity of thickness and shape of the gate bird's beak 6, the DMOS 1 can be manufactured with reduction of irregularity of a characteristic and increase of a yield of the DMOS 1.

According to exemplary embodiments of the present invention, the source layer can be formed to have a stable shape without being affected by irregularity of thickness and shape of the gate bird's beak, which may result in reduction of irregularity of a characteristic and increase of a yield of the DMOS type semiconductor device.

While the present invention has been shown and described with reference to certain exemplary embodiments thereof, it will be understood by those skilled in the art that various changes in form and details may be made therein without departing from the spirit and scope of the invention as defined by the appended claims.

What is claimed is:

1. A method for manufacturing a DMOS type semiconductor device, comprising:
    providing a silicon substrate;
    diffusively forming a buried diffusion layer on a main surface of the silicon substrate;
    forming an eptaxial growth layer on the silicon substrate and the buried diffusion layer;
    forming an isolation oxide layer on the epitaxial growth layer with an ion implantation opening;
    forming a gate oxide film on the epitaxial growth layer within the ion implantation opening;
    forming a gate on the gate oxide film;
    diffusively forming a body layer in the epitaxial growth layer by implanting ions of an impurity element having a first conduction type from the ion implantation opening;
    diffusively forming a regulation layer in the body layer by implanting ions of an impurity element having a second conduction type opposite to the first conduction type from the ion implantation opening, the regulation layer being shallower than the body layer; and
    diffusively forming a source layer in the regulation layer by implanting ions of an impurity element having the second conduction type from the ion implantation opening,
    wherein the source layer is formed within the regulation layer which is formed so as to horizontally extend beyond a region in which a gate bird's beak occurs due to thermal oxidation treatment performed after the body layer is formed and extends from an end of the gate which is formed on the gate oxide film toward underlying layers of the gate, the gate bird's beak in which a thickness and a shape of the gate oxide film are unstable.

2. The method as set forth in claim 1, wherein the regulation layer is formed by implanting the ions of the impurity element into the body layer using the end of the gate as a self-alignment.

3. The method as set forth in claim 2, wherein the regulation layer is formed by obliquely implanting the ions of the impurity element from the ion implantation opening.

4. The method as set forth in claim 1, wherein a part of the regulation layer is formed beneath a part of the gate through the gate oxide film.

* * * * *